United States Patent
Chen et al.

(10) Patent No.: US 8,050,038 B2
(45) Date of Patent: Nov. 1, 2011

(54) HEAT DISSIPATION DEVICE

(75) Inventors: Chun-Chi Chen, Taipei Hsien (TW);
Hong-Cheng Yang, Shenzhen (CN);
Xin-Lei Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 308 days.

(21) Appl. No.: 12/504,681

(22) Filed: Jul. 17, 2009

(65) Prior Publication Data

US 2010/0258276 A1 Oct. 14, 2010

(30) Foreign Application Priority Data

Apr. 10, 2009 (CN) .......................... 2009 1 0301478

(51) Int. Cl.
*H05K 7/20* (2006.01)
*G06F 1/20* (2006.01)

(52) U.S. Cl. .............. 361/719; 361/679.47; 361/679.48; 361/679.52; 361/679.54; 361/679.55; 361/695; 361/697; 361/700; 361/704; 361/709; 165/80.2; 165/80.3; 165/104.33; 165/185

(58) Field of Classification Search . 361/679.47–679.48, 679.52, 679.54–679.55, 361/695, 697, 700, 704, 709, 719; 165/80.2–80.3, 165/104.33, 185
See application file for complete search history.

(56) References Cited

U.S. PATENT DOCUMENTS

| | | | |
|---|---|---|---|
| 6,301,107 B1 * | 10/2001 | Lev et al. ................. | 361/679.52 |
| 6,366,460 B1 * | 4/2002 | Stone et al. .............. | 361/679.47 |
| 6,570,761 B2 * | 5/2003 | Stone et al. .............. | 361/679.47 |
| 6,883,594 B2 * | 4/2005 | Sarraf et al. ............. | 165/104.33 |
| 7,312,997 B2 * | 12/2007 | Huang et al. ................. | 361/704 |
| 7,405,937 B1 * | 7/2008 | Wang et al. ................. | 361/700 |
| 7,489,510 B1 * | 2/2009 | Hung et al. ................. | 361/700 |
| 7,697,288 B2 * | 4/2010 | Okutsu ........................ | 361/695 |
| 7,710,724 B2 * | 5/2010 | Takeguchi et al. ............ | 361/700 |
| 7,855,889 B2 * | 12/2010 | Hung et al. ................. | 361/700 |
| 7,885,075 B2 * | 2/2011 | Li et al. ........................ | 361/701 |
| 7,990,713 B2 * | 8/2011 | Liu et al. ....................... | 361/700 |
| 2007/0253769 A1 * | 11/2007 | Hwang et al. ................. | 403/326 |
| 2009/0229791 A1 * | 9/2009 | Hung et al. ................. | 165/80.3 |
| 2010/0059202 A1 * | 3/2010 | Li et al. ........................ | 165/80.3 |
| 2010/0258277 A1 * | 10/2010 | Chen et al. .............. | 165/104.26 |
| 2010/0307719 A1 * | 12/2010 | Yang et al. ............... | 165/104.26 |
| 2011/0146949 A1 * | 6/2011 | Yang et al. ........................ | 165/67 |

* cited by examiner

*Primary Examiner* — Robert J Hoffberg
(74) *Attorney, Agent, or Firm* — Altis Law Group, Inc.

(57) ABSTRACT

A heat dissipation device for dissipating heat from an electronic component mounted on a printed circuit board, includes a fin unit, a heat-conducting board attached to the electronic component, a heat pipe thermally connecting the fin unit and the heat-conducting board, and a clip disposed on the heat pipe. Two engaging portions protrude upwardly from a top face of the heat-conducting board towards each other. The heat pipe extends between the two engaging portions. The two engaging portions press two opposite ends of the clip downwardly, thereby securing the heat pipe to the top face of the heat-conducting board.

13 Claims, 5 Drawing Sheets

HEAT DISSIPATION DEVICE

BACKGROUND

1. Technical Field

The disclosure generally relates to heat dissipation devices and, more particularly, to a heat dissipation device incorporating heat pipes.

2. Description of Related Art

With the fast development of electronic industry, advanced electronic components such as CPUs (central processing units), or GPUs (graphics processing units) are being made with ever faster operating speeds. In addition, successive new models of mobile computers, such as notebook computers, are continuing to shrink in size and become lighter, smaller and thinner. Thus, with the improvement of the functionality of the notebook computers, heat generated from CPUs, GPUs, disk drives, power supplies and other components of the notebook computers is often increased. Greater emphasis is now being laid on increasing the efficiency and effectiveness of heat dissipation devices so as to keep operational temperature of the electronic components within a suitable range.

Nowadays, heat pipes, which operate by phase change of working liquid sealed therein, have been widely used due to their excellent heat transfer properties. Accordingly, heat dissipation devices equipped with heat pipes appear in many current applications and are widely used, with optimal performance thereof towards a common goal in current R & D efforts.

However, since the notebook computers are continuing to shrink in size and become thinner, a distance between the heat-generating components within the notebook computer and a shell of the notebook computer becomes smaller and smaller. It is difficult to dissipate heat generated from the heat-generating components effectively, particularly, to ensure a temperature of the heat-generating components within a safe threshold level.

What is needed, therefore, is a heat dissipation device incorporating heat pipes with enhanced heat dissipation performance.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
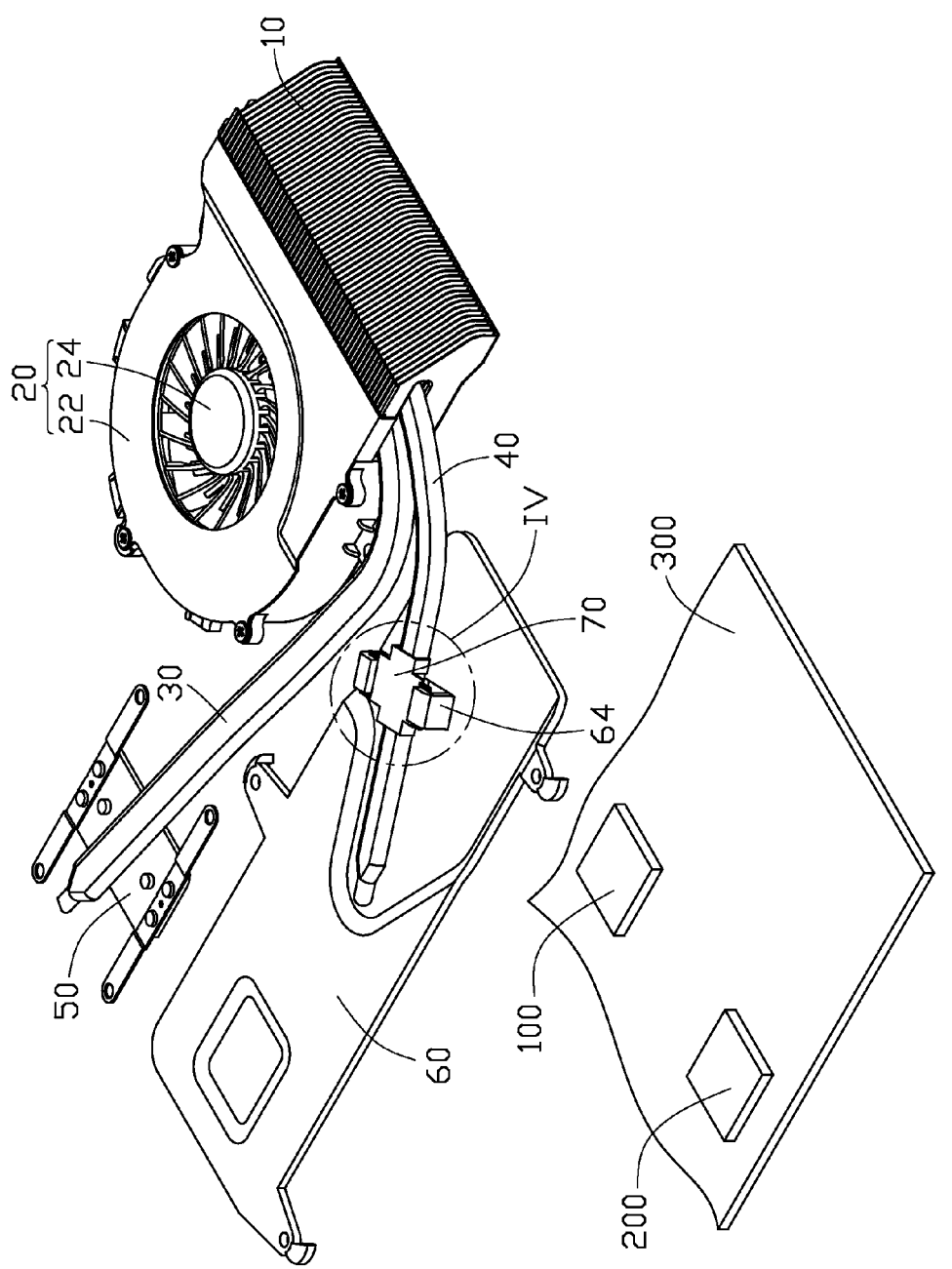
FIG. 1 is an assembled, isometric view of a heat dissipation device in accordance with an embodiment of the disclosure, with a printed circuit board having electronic components positioned thereon.
Figure 2:
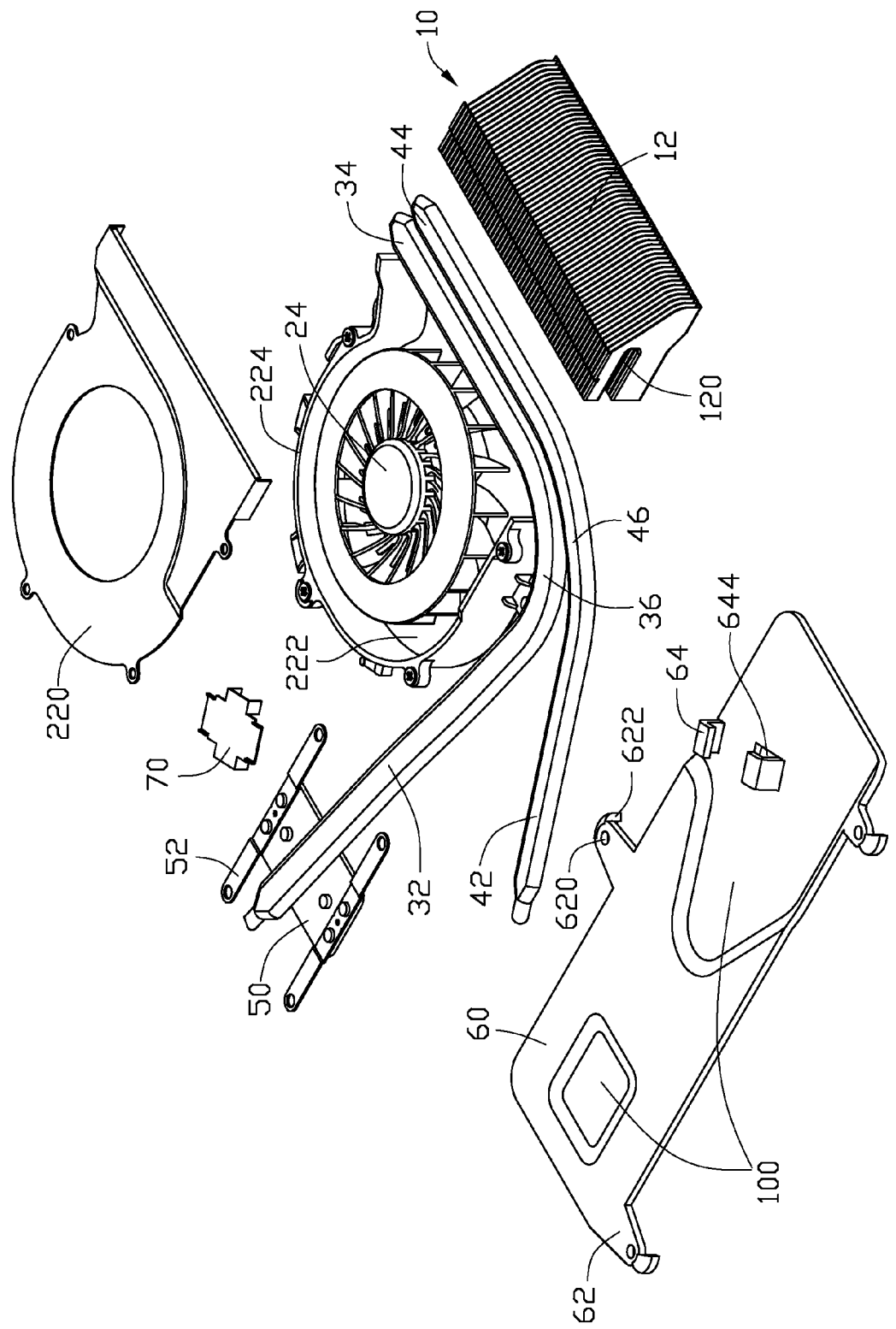
FIG. 2 is an exploded view of the heat dissipation device of FIG. 1.
Figure 3:
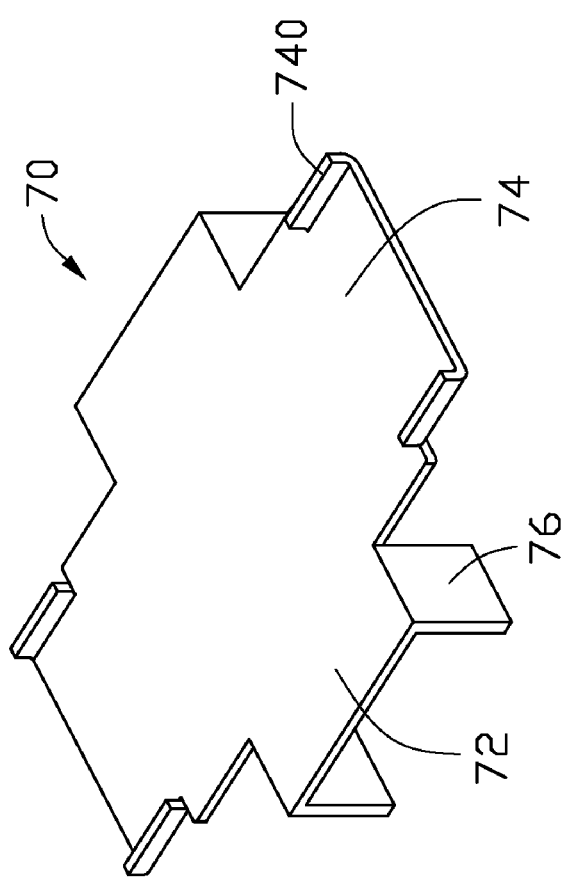
FIG. 3 is an enlarged view of a clip of the heat dissipation device of FIG. 1.

Referring to FIGS. 1-2, a heat dissipation device in accordance with an embodiment of the disclosure dissipates heat from a first electronic component 100 such as a CPU (central processing unit) and a second electronic component 200 such as a GPU (graphics processing unit) simultaneously, which are arranged on a printed circuit board 300. The heat dissipation device comprises a fin unit 10, a centrifugal fan 20 located adjacent thereto, a first heat pipe 30 and a second heat pipe 40 thermally connecting with the fin unit 10, a first heat-conducting board 50 thermally attached to the first electronic component 100, a second heat-conducting board 60 thermally attached to the second electronic component 200, and a clip 70 engaging with the second heat-conducting board 60 and securing the second heat pipe 40 to the second heat-conducting board 60. The heat pipes 30, 40 connect the heat-conducting boards 50, 60 and the fin unit 10, respectively.

The fin unit 10 comprises a plurality of fins 12, each of which consists of an upright sheet body and a pair of flanges bent horizontally from a top and a bottom of the sheet body and engaging with the sheet body of an adjacent fin 12. Every two adjacent fins 12 form a passage therebetween for allowing airflow therethrough. An elongated receiving groove 120 is defined at a lateral side of the fin unit 10 and faces the centrifugal fan 20, for accommodating parts of the heat pipes 30, 40 therein. The receiving groove 120 extends transversely and perpendicularly through the fin unit 10.

The centrifugal fan 20 comprises a housing 22 engaging with the fin unit 10 and an impeller 24 rotatably disposed in the housing 22. The housing 22 comprises a top plate 220, a bottom plate 222 located opposite to the top plate 220 and a volute sidewall 224 extending upwardly from an outer periphery of the bottom plate 222 and fixed to the top plate 220. Each of the top plate 220 and the bottom plate 222 defines a through hole at a center thereof for functioning as an air inlet for the centrifugal fan 20. The top plate 220, the bottom plate 222, and the sidewall 224 cooperatively define a receiving space for receiving the impeller 24 therein. The sidewall 224 defines a rectangular air outlet at a lateral side of the housing 22. The fin unit 10 is partly received in the air outlet of the housing 22, and the passages of the fin unit 10 directly communicate with the air outlet.

The first heat pipe 30 comprises a straight first evaporating section 32, a straight first condensing section 34 and a bended first connecting section 36 interconnecting the first evaporating section 32 and the first condensing section 34. The first evaporating section 32 is thermally attached to the first heat-conducting board 50. The first condensing section 34 is thermally received in the receiving groove 120 of the fin unit 10. A bottom face and a top face of the first heat pipe 30 are planar.

The first heat-conducting board 50 is a rectangular plate, and made of a metal with good heat conductivity, such as aluminum, copper, or an alloy thereof. A bottom face of the first heat-conducting board 50 is correspondingly attached to the first electronic component 100. The first evaporating section 32 of the first heat pipe 30 is mounted on a top face of the first heat-conducting board 50. Two mounting members 52 are further provided to the first heat-conducting board 50, for fixing the first heat-conducting board 50 to the printed circuit board 300. The two mounting members 52 are disposed at two opposite lateral sides of the first heat-conducting board 50, respectively. The first heat pipe 30 is soldered to the top face of the first heat-conducting board 50 or clasped by a tab, which spans and abuts against a top face of the first evaporating section 32 of the first heat pipe 30, thereby securing the first heat pipe 30 on the first heat-conducting board 50.

The second heat pipe 40 is similar to the first heat pipe 30, and comprises a straight second evaporating section 42, a straight second condensing section 44 and a bended second connecting section 46 interconnecting the second evaporating section 42 and the second condensing section 44. The second evaporating section 42 is thermally attached to the second heat-conducting board 60. The second condensing section 44 is thermally received in the receiving groove 120 of the fin unit 10 and located juxtaposed to the first condensing section 34 of the first heat pipe 30. A bottom face and a top face of the second heat pipe 40 are planar. The second heat pipe 40 is coplanar with the first heat pipe 30.

Figure 4:
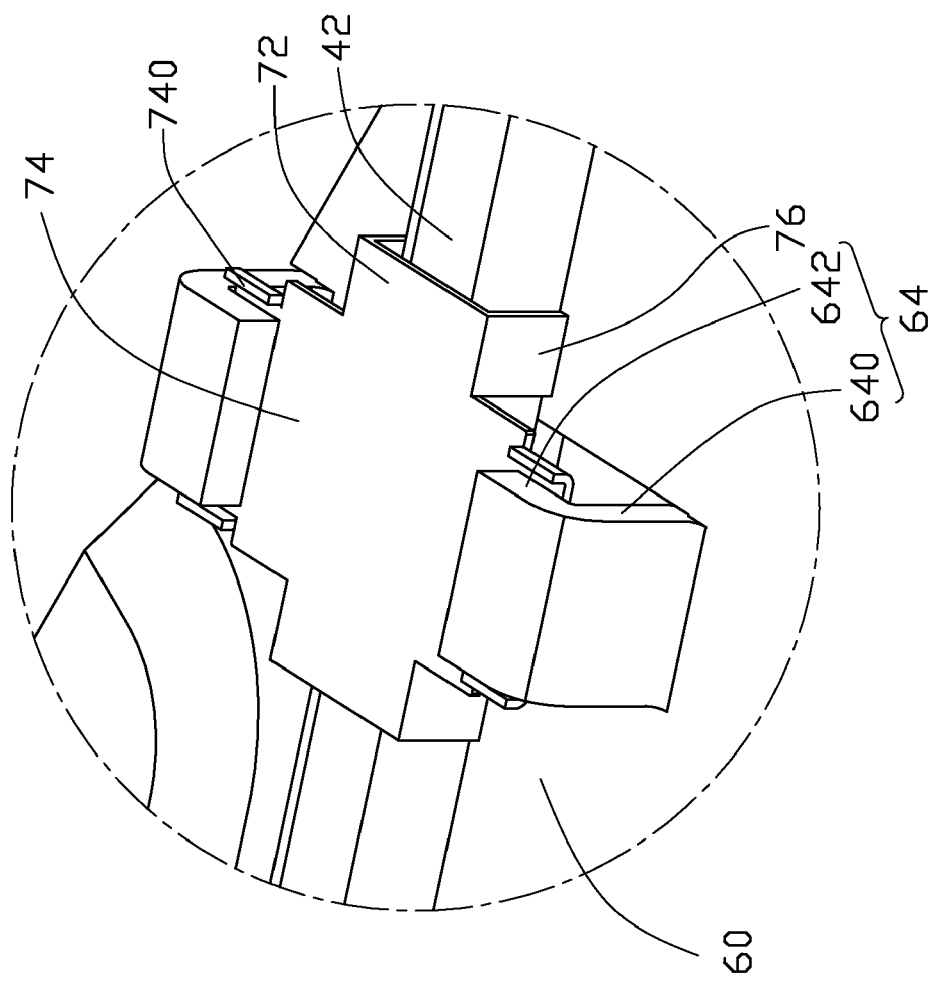
FIG. 4 is an enlarged view of part IV of the heat dissipation device of FIG. 1.

Also referring to FIG. 4, the second heat-conducting board 60 is an approximately rectangular plate, and made of a metal with good heat conductivity, such as aluminum, copper, or an alloy thereof. A bottom face of the second heat-conducting board 60 is correspondingly attached to the second electronic component 200. A plurality of spaced mounting arms 62 extending outwardly and horizontally from an outer periphery of the second heat-conducting board 60. Each of the mounting arms 62 defines a mounting hole 620 at a center thereof, for a screw (not shown) extending therethrough to mount the second heat-conducting board 60 on the printed circuit board 300. A positioning hook 622 is bent downwardly from a distal end of each mounting arm 62 to locate the second heat-conducting board 60 at a desired position. Two invert L-shaped engaging portions 64 protrude upwardly from a top face of the second heat-conducting board 60 towards each other. The two engaging portions 64 are aligned with each other. Each of the two engaging portions 64 comprises an upright section 640 (see FIG. 4) protruding upwardly and perpendicularly from the top face of the second heat-conducting board 60 and a pressing section 642 bent horizontally from an upper end of the upright section 640. Each engaging portion 64 is integrally formed by stamping a corresponding part of the second heat-conducting board 60, whereby a stamped hole 644 is formed in the second heat-conducting board 60 corresponding to the engaging portion 64. The second evaporating section 42 of the second heat pipe 40 is attached to the top face of the second heat-conducting board 60 and extends between the two engaging portions 64. In a preassembled state, a distance between each of the pressing sections 642 of the engaging portions 64 and the top face of the second heat-conducting board 60 is slightly more than a distance between the top face and the bottom face of the second evaporating section 42 of the second heat pipe 40, i.e. a height of the second evaporating section 42; a distance between the two upright sections 640 of the engaging portions 64 is more than a distance between two opposite lateral sides of the second evaporating section 42 of the second heat pipe 40, i.e. a width of the second evaporating section 42.

The clip 70 is integrally formed by stamping and bending a resilient metal sheet. The clip 70 comprises an elongated main body 72, two arms 74 extending outwardly and horizontally from centers of two lateral sides of the main body 72, respectively, and two pairs of sidewalls 76 formed at two longitudinal ends of the main body 72, respectively. Each lateral sidewall 76 extends downwardly and perpendicularly from a corresponding lateral side of the main body 72. The main body 72, the arms 74 and the sidewalls 76 are all in a rectangular shape. The main body 72 is disposed on and spans the top face of the second evaporating section 42 of the second heat pipe 40. The two arms 74 abut against bottom faces of the two pressing sections 642 of the two engaging portions 64, respectively. Two flanges 740 are bent upwardly from two opposite lateral sides of each arm 74 at a distal end thereof, respectively. The two flanges 740 of each arm 74 of the clip 70 are located beyond two opposite lateral sides of the pressing section 642 when the engaging portions 64 engage with the arms 74, respectively, for preventing the clip 70 from escaping from the two engaging portions 64. The two sidewalls 76 of each pair are attached to the two lateral sides of the second evaporating section 42, respectively. A height of each of the sidewalls 76 is less than that of the second evaporating section 42 of the second heat pipe 40.

Figure 5:
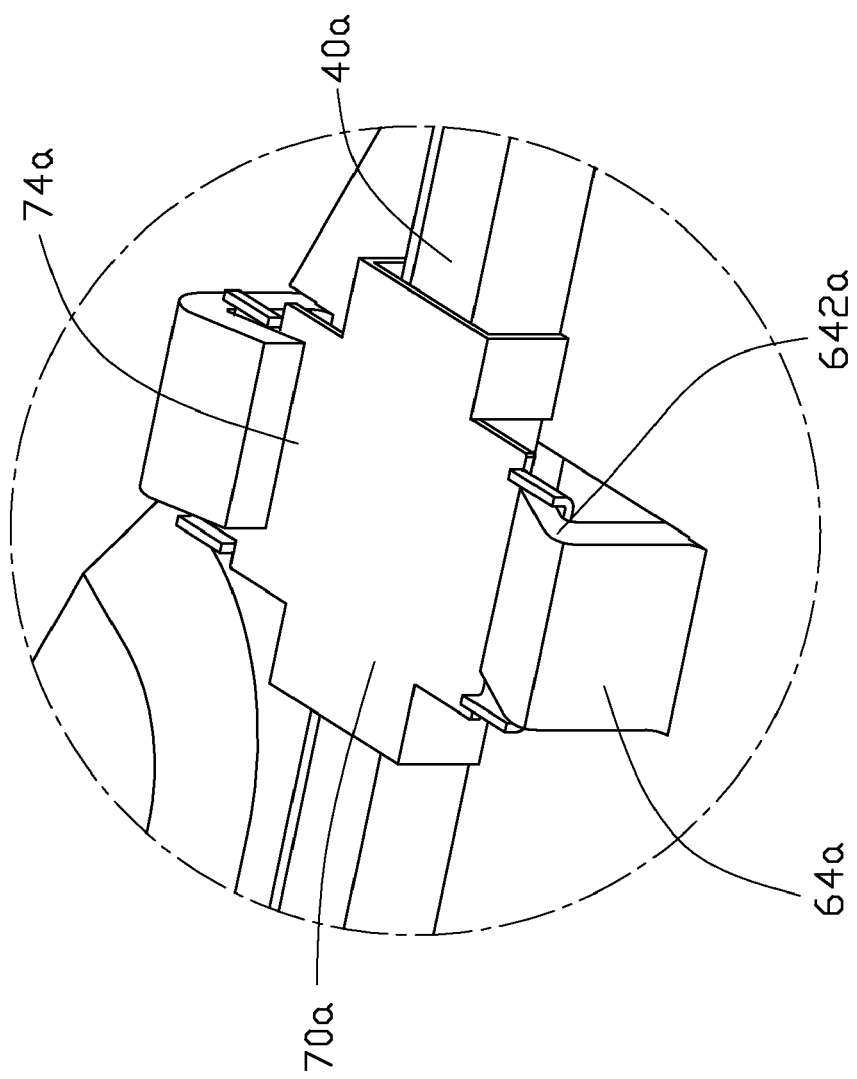
FIG. 5 is an enlarged view of a part of a heat dissipation device of another embodiment of the disclosure.

Referring to FIG. 5 also, in assembly of the heat dissipation device, the clip 70 is sandwiched between the two engaging portions 64 and the second evaporating section 42 of the second heat pipe 40; the pressing sections 642 press the arms 74 of the clip 70 downwardly; the main body 72 is impelled by the two arms 74 to move downwardly and abut against the top face of the second evaporating section 42 of the second heat pipe 40, thereby securing the second evaporating section 42 to the second heat-conducting board 60 tightly and firmly. The two pairs of sidewalls 76 clasp the heat pipe 40 at a front and rear locations thereof, thereby securing the heat pipe 40 to the clip 70. Referring to FIG. 5, for a more reliable engagement between the two engaging portions 64a and the clip 70a, the pressing sections 642a of the two engaging portions 64a can be further pressed to extend inclinedly and downwardly, thereby the pressing sections 642a abutting against the two arms 74a of the clip 70a more tightly; thus, the clip 70a can secure the second heat pipe 40a more firmly and reliably.

In use of the heat dissipation device, the first and second electronic components 100, 200 generate a lot of heat. The heat is absorbed by the first and second heat-conducting boards 50, 60, then transferred by the first and second heat pipes 30, 40 to the fin unit 10, and finally dispersed into ambient air via the fin unit 10 in which airflow supplied by the centrifugal fan 20 flows through the fin unit 10, thereby preventing the electronic components 100, 200 from overheating.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device adapted for dissipating heat from an electronic component mounted on a printed circuit board, the heat dissipation device comprising:

a fin unit;

a heat-conducting board for being attached to the electronic component, two engaging portions, each of the two engaging portions comprises an upright section protruding upwardly from a top face of the heat-conducting board and a pressing section bent inwardly from a distal end of the upright section, the pressing section of the each of the two engaging portions extend towards each other;

a heat pipe thermally connecting the fin unit and the heat-conducting board, and the heat pipe extending between the two engaging portions; and a clip disposed on the heat pipe, the clip comprises an elongated main body, two arms extending outwardly from two opposite lateral sides of a central part of the main body respectively, and two pairs of sidewalls, each pair of the two pairs of sidewalls formed at each of the two longitudinal ends of the main body and extending downwardly from each of the two opposite lateral sides of the main body, wherein each of the two arms of the clip abut against a corresponding bottom face of the pressing section of the two engaging portions pressing two opposite ends of the clip downwardly to urge the clip to press the heat pipe towards the heat-conducting board, thereby securing the heat pipe to the top face of the heat-conducting board.

2. The heat dissipation device as claimed in claim 1, wherein the pressing section of the each of the two engaging portions extends inclinedly and downwardly.

3. The heat dissipation device as claimed in claim 1, wherein the elongated main body is disposed on and spans a top face of the heat pipe.

4. The heat dissipation device as claimed in claim 1, wherein two flanges are bent upwardly from each of two opposite lateral sides of each of the two arms, respectively, and the two flanges are located beyond two opposite lateral sides of the pressing section of the each of the two engaging portions, respectively.

5. The heat dissipation device as claimed in claim 1, wherein the two sidewalls are attached to two lateral sides of the heat pipe, respectively, and a height of each of the two sidewalls is less than a height of the heat pipe.

6. The heat dissipation device as claimed in claim 1, wherein the heat pipe comprises an evaporating section attached to the heat-conducting board, a condensing section attached to the fin unit, and a bended connecting section interconnecting the evaporating section and the condensing section.

7. The heat dissipation device as claimed in claim 6, wherein a top face and a bottom face of the heat pipe are planar.

8. The heat dissipation device as claimed in claim 6 further comprising another heat-conducting board for being attached to another electronic component mounted on the printed circuit board, and another heat pipe thermally connecting the fin unit and the another heat-conducting board.

9. The heat dissipation device as claimed in claim 8, wherein the condensing section of the heat pipe and another condensing section of the another heat pipe are located juxtaposed to each other, the another condensing section of the another heat pipe being attached to the fin unit.

10. The heat dissipation device as claimed in claim 9, wherein a centrifugal fan is located adjacent to the fin unit, and the centrifugal fan comprises a housing and an impeller rotatably disposed in the housing, and an air outlet is defined at a lateral side of the housing, and the fin unit is partly received in the air outlet.

11. The heat dissipation device as claimed in claim 10, wherein an elongated receiving groove is defined at a lateral side of the fin unit facing the air outlet of the centrifugal fan, the condensing section of the heat pipe and the another condensing section of the another heat pipe being accommodated in the elongated receiving groove and thermally connected to a portion of the fin unit surrounding the elongated receiving groove.

12. The heat dissipation device as claimed in claim 1, wherein a plurality of spaced mounting arms extend outwardly and horizontally from an outer periphery of the heat-conducting board, and each of the plurality of spaced mounting arms defines a mounting hole at a center thereof.

13. The heat dissipation device as claimed in claim 12, wherein a positioning hook is bent downwardly from an end of the each of the plurality of spaced mounting arms to secure the heat-conducting board to the printed circuit board.

\* \* \* \* \*